United States Patent [19]

Foerster

[11] 3,761,831

[45] Sept. 25, 1973

[54] COMMON MODE REJECTION MEANS FOR DIFFERENTIAL CIRCUITS

[75] Inventor: Roy P. Foerster, Thousand Oaks, Calif.

[73] Assignee: The Bunker-Rambo Corporation, Oak Brook, Ill.

[22] Filed: Feb. 28, 1972

[21] Appl. No.: 230,150

Related U.S. Application Data

[63] Continuation of Ser. No. 860,636, Sept. 24, 1969, abandoned.

[52] U.S. Cl. .................................... 330/69, 330/99
[51] Int. Cl. .............................................. H03f 1/00
[58] Field of Search ............................ 330/30 D, 69

[56] References Cited

UNITED STATES PATENTS

| | | | |
|---|---|---|---|
| 2,977,547 | 3/1961 | Talambiras | 330/69 |
| 3,389,340 | 6/1968 | Forbes | 328/155 |
| 3,516,005 | 6/1970 | Brown, Jr. | 330/69 |

*Primary Examiner*—Nathan Kaufman
*Attorney*—Frederick M. Arbuckle

[57] ABSTRACT

Electronic circuit apparatus for increasing the common mode rejection capability of a differential circuit. The circuit apparatus is comprised of a network which algebraically operates on first and second input signals, each comprised of an input information component and a common mode noise component, to cancel the common mode noise components and isolate the input information components for application to the differential circuit. Significantly, first and second input signal paths through the network are formed of passive components, thus permitting the paths to be easily balanced. The only active components in the network are contained within a common mode signal path which need not be balanced, but merely stable. As a consequence, prior art problems caused by unequal phase delays in first and second input signal paths are avoided.

7 Claims, 3 Drawing Figures

Patented Sept. 25, 1973 3,761,831

INVENTOR.
ROY P. FOERSTER
BY Lindenberg + Freilich
ATTORNEYS

COMMON MODE REJECTION MEANS FOR DIFFERENTIAL CIRCUITS

This is a continuation of application Ser. No. 860,636, filed Sept. 24, 1969 now abandoned.

BACKGROUND OF THE INVENTION

1. Field of the Invention:

This invention relates generally to differential circuits such as differential amplifiers and more particularly to means for increasing the common mode noise rejection capability of such circuits.

2. Description of the Prior Art:

Differential amplifiers are very commonly used in data systems as signal conditioning amplifiers, subtractors, noise rejection devices, etc. In these applications, one of the more important amplifier characteristics is the common mode rejection ratio (CMRR). It is desirable that the CMRR should be as high as possible to avoid the common mode components of the input signal appearing at the output of the amplifier. Typically, CMRR values in a range from as little as 50 db to greater than 130 db are desired.

It is not difficult to design a differential amplifier which has a high CMRR at low frequencies. Most amplifier specifications provide the CMRR value at DC even though the amplifier is intended for use at high frequencies. Thus, such specifications are often misleading inasmuch as the CMRR of differential amplifiers normally deteriorates rapidly as frequency increases. In certain differential amplifiers, the CMRR at high frequencies is so bad that the amplifier may actually exhibit a common mode gain.

The deterioration of the CMRR at high frequencies is attributable primarily to the differences in gain between the two signal paths of the differential circuit. As the input frequencies increase, the mismatch between the two signal paths gets worse and the CMRR decreases. Techniques for maintaining balance in the two signal paths have been refined but, as the amplifiers are pushed into the 10 or 20 megahertz region, the known techniques have proved to be inadequate for the task.

The present invention is directed toward an improved differential circuit arrangement exhibiting a substantially uniformly high common mode rejection capability up to very high frequencies.

SUMMARY OF THE INVENTION

Briefly, in accordance with the present invention, a circuit network is provided between a pair of input terminals and a conventional differntial circuit for operating on first and second input signals, each comprised of both an input information component and a common mode noise component, for cancelling any common mode noise and isolating the input information components for application to the differential circuit. The network in accordance with the invention is characterized by including only passive resistive first and second input signal paths. Frequency dependent components are contained solely within a common mode path. Thus, use of a network in accordance with the invention avoids the introduction of any differential phase delays which has, in the prior art, limited the common mode rejection ratio of differential circuits at high frequencies.

Figure 1:
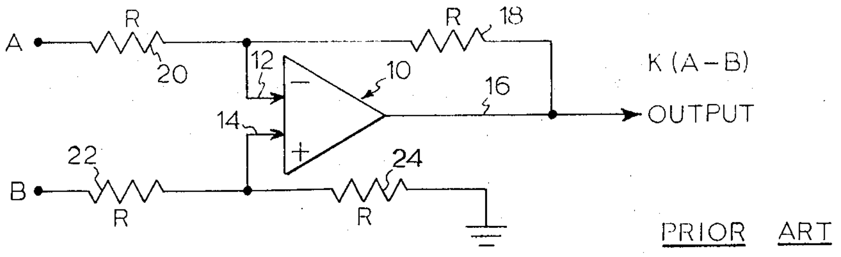
FIG. 1 is a block schematic diagram of a differential amplifier circuit utilized in accordance with the teachings of the prior art.

Attention is now called to FIG. 1 of the drawing which illustrates a conventional differential amplifier 10 connected in a typical configuration. The amplifier 10 is normally provided with first and second input terminals 12 and 14 and an output terminal 16. Typically, the output terminal 16 is connected through a resistor 18 to the amplifier input terminal 12. An input signal A is applied to the amplifier input terminal 12 through a resistor 20. An input signal B is applied to the amplifier input terminal 14 through a resistor 22. Amplifier input terminal 14 is connected through a resistor 24 to ground.

The function of the amplifier 10 of FIG. 1 is to provide an output signal proportional to the difference between the applied input signals A and B. Thus the output signal in FIG. 1 is intended to be K(A − B). In other words, the function of the amplifier 10 is strictly to amplify the difference between the applied input signals A and B and to disregard any common mode inputs, i. e., input signals appearing on both input terminals. If the gain of the amplifier 10 is high and the values of the resistors of FIG. 1 are closely matched, the common mode rejection capability of the amplifier will be excellent at low frequencies. However, as the frequency of the common mode signal increases, two effects become apparent. First, the amplifier gain starts to decrease so that the cancellation of the common mode signal becomes incomplete. Second, the differences in the phase delay of the two input signal paths become significant. That is, note that the signal path seen by input B is a direct resistive path to ground which has essentially no phase delay. On the other hand, the signal path seen by input A goes through a resistor and then through the amplifier and back through another resistor. Therefore, the signal path of input A incorporates a phase delay not contained in the signal path seen by input B. At low frequencies, this phase delay difference is not detrimental. However, as the frequency of the common mode signal component increases, the phase delay difference can approach a 180° phase shift and the common mode rejection ratio (CMRR) can in fact become a common mode gain.

The present invention is directed to a circuit apparatus useful in conjunction with a differential circuit configuration as exemplified by the amplifier of FIG. 1 for maximizing the common mode rejection capability of the differential circuit. FIG. 2 again illustrates the differential amplifier 10 having input terminals 12 and 14 and an output terminal 16. Output terminal 16 is connected to amplifier input terminal 12 through resistor 18. Amplifier input terminal 14 is connected to ground through resistor 24. In addition, amplifier input terminal 12 is connected through resistor 20 to a network input terminal 26. Similarly, amplifier input terminal 14 is connected through resistor 22 to a network input terminal 28.

In accordance with the invention, a circuit apparatus is provided between the network input terminals 26 and 28 and the amplifier input terminals 12 and 14 to effectively cancel any common mode signal components prior to application to the amplifier 10. More particularly, a voltage divider comprised of resistors 32 and 34 is connected between network input terminals 26 and 28. The junction 36 therebetween is connected through a capacitor 38 to the input terminal of a unity gain inverting amplifier 40. The output of the amplifier 42 is returned through a resistor 40 to the amplifier input terminal. Additionally, the output of the amplifier 40 is connected through a phase lead network comprised of a resistor 44 and capacitor 46 connected in parallel, to a junction 48 between first and second summing resistors 50 and 52. Resistor 50 connects junction 48 to amplifier input terminal 12. Summing resistor 52 connects junction 48 to amplifier input terminal 14.

Figure 2:
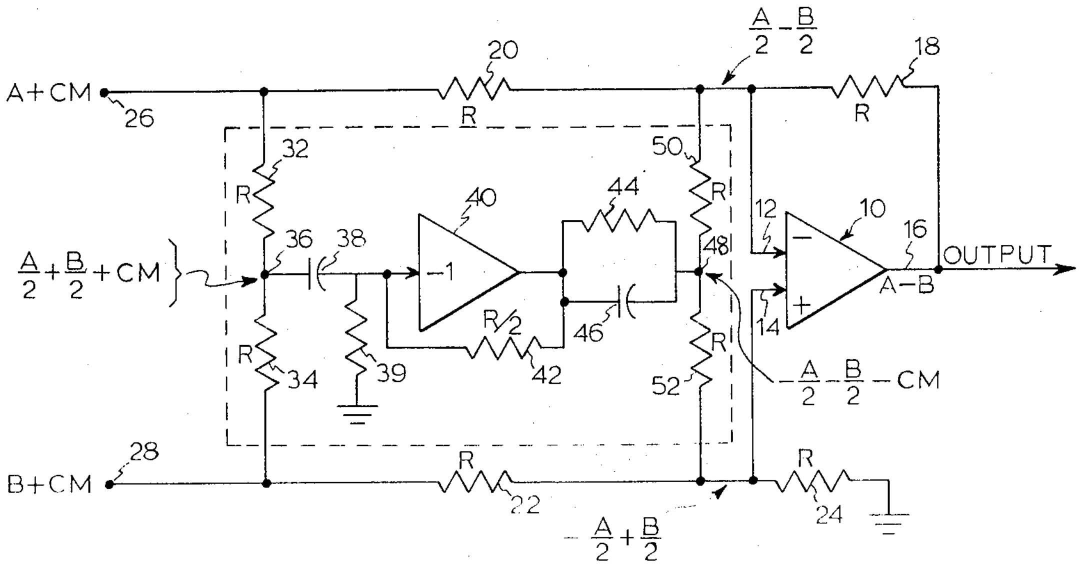
FIG. 2 is a block schematic diagram illustrating a differential amplifier circuit coupled to a network in accordance with the present invention.

In order to understand the operation of the circuit arrangement of FIG. 2, the input signals applied to network terminals 26 and 28 will be respectively represented as (A + CM) and (B + CM). The terms A and B respectively represent input information components of the two input signals while the term CM represents the common mode noise appearing on both terminals 26 and 28. The voltage divider comprised of resistors 32 and 34 forms the signal (A/2 + B/2 + CM) at the junction 36. The amplifier 40 inverts the input signal applied thereto to thus yield a cancellation signal (−A/2 − B/2 − CM) at the junction 48. The phase lead introduced by the compensation network comprised of resistor 44 and capacitor 46 compensates for the phase lag which would normally be introduced by the amplifier 40. The objective of the components contained between junctions 36 and 48 is to merely invert the signal available at junction 36 without introducing any net phase lead or lag.

The cancellation signal thus available at junction 48 is summed with the input signal A + CM provided through resistor 20 to thus yield the signal (A/2 − B/2) at amplifier input terminal 12. Similarly, the signal at junction 48 is summed with the signal (B + CM) provided at the network input terminal 28 to yield the signal (−A/2 + B/2) at the amplifier input terminal 14. It will be appreciated that the difference between the signals thus applied to the input terminals of amplifier 10 equals (A − B); i.e.,.$(A/2 - B/2) - (-A/2 + B/2) = A - B$. Accordingly, from the foregoing treatment it will be recognized that the common mode component has been cancelled prior to application to the input terminals of amplifier 10 and thus the common mode signal will not appear on the output terminal 16 of amplifier 10. Although the high frequency amplifier 40 may produce a DC component at the junction 48, it will appear as common mode noise at the input of amplifier 10 and thus will be of no significance inasmuch as the amplifier 10 is assumed to have a high common mode rejection ratio at low frequencies which ratio deteriorates only at high frequencies. Thus the common mode component produced by the amplifier 40 at junction 48 will be eliminated by the low frequency rejection capability of the amplifier 10.

The function of the circuitry in accordance with the invention introduced between network input terminals 26 and 28 and amplifier input terminals 12 and 14 is to overcome the problem of deterioration of the common mode rejection ratio of amplifier 10 at high frequencies. As has been seen, common mode cancellation in accordance with the invention is achieved without introducing a phase difference or gain difference between two signal paths respectively seen by the input signals. That is, the first input signal A + CM is passed to the amplifier input terminal 12 through a frequency independent completely resistive path 20. Similarly, the signal B + CM is passed to amplifier input terminal 14 through resistor 22. Since the signal paths defined by resistors 20 and 22 are frequency independent and passive, they can be easily balanced thus avoiding the introduction of any differential gain or phase delay prior to the input terminals 12 and 14 of amplifier 10. The common mode signal path through the high frequency amplifier 40 does not have to be balanced because it is carrying both input signals. The common mode signal path need merely be stable. Inasmuch as the amplifier 10 normally exhibits an excellent common mode rejection ratio at low frequencies, the high frequency common mode path including amplifier 40 can be inoperative at low frequencies. The inclusion of coupling capacitor 38 effectively opens the path through amplifier 40 at low frequencies.

Figure 3:
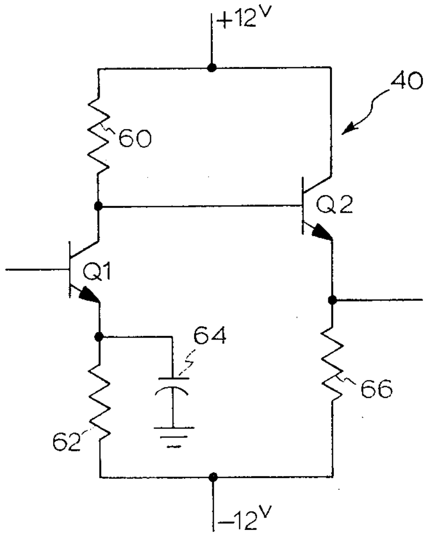
FIG. 3 is a schematic diagram of a typical high frequency amplifier which can be employed in the apparatus of FIG. 2.

The particular design of the high frequency amplifier 40 is not critical. That is, several different amplifier configurations will suffice. For example, the relatively simple amplifier of FIG. 3, with properly selected component values, will satisfactorily function in the configuration of FIG. 2. The amplifier of FIG. 3 includes a first transistor Q1 whose collector is connected through a resistor 60 to a source of positive potential of +12 volts. The emitter of transistor of Q1 is connected through resistor 62 to a −12 volt potential and through a capacitor 64 to ground. The base of transistor Q1 is of course connected to the amplifier input terminal; i.e., to the junction between capacitor 38 and resitor 39. The collector of transistor Q1 is connected to the base of transistor Q2 which is connected in an emitter follower configuration. That is, the emitter of transistor Q1 is connected through resistor 66 to the −12 volt source. The collector of transistor Q2 is connected to the source of +12 volt potential. The output of amplifier 40 is of course taken from the emitter of transistor Q2.

As previously noted, although a certain amount of phase delay may be introduced by the amplifier 40, this phase delay in the common mode path is not significant because it can be easily compensated for by a phase lead network comprised of resistor 44 and capacitor 46. It is important to note that in contrast to the prior art, it is possible to utilize compensation networks in the common mode rejection circuit of the present invention because the compensation is placed within a single common mode path. That is, in a conventional differential amplifier, matched compensation networks must be utilized in the two different signal paths and as previously mentioned, it is exceedingly difficult to properly match the compensation networks at all frequencies. It is further pointed out that the amplifier 40 can be designed to have a very small phase delay inasmuch as it need not have much gain nor a low frequency response.

From the foregoing, it will be recognized that a circuit apparatus has been disclosed herein for increasing the common mode rejection capability of a differential circuit. High frequency common mode noise is rejected by providing a network which algebraically operates on first and second input signals to cancel common mode components of the signals. Significantly, the first and second input signal paths through the network in accordance with the invention are formed of frequency independent passive components, thus permitting the paths to be easily balanced. The only active components in the network are contained within a common mode signal path which need not be balanced. As a consequence, problems in the prior art caused by unequal phase delays are avoided.

I claim:

1. Electronic circuit apparatus for amplifying the difference between first and second input signals with high common mode rejection over a wide frequency range, said first and second input signals being representable as (A + CM) and (B + CM), where (A − B) is the differential signal which it is desired be amplified by said apparatus, and where (CM) is the common mode signal contained in each of the input signals which it is desired be rejected by said apparatus, said apparatus comprising:

a common mode cancellation circuit to which said input signals are applied for producing first and second common mode cancellation circuit output signals having a difference proportional to (A − B) and with no common mode signal (CM) being contained in either of said first and second cancellation circuit output signals, and a differential amplifier to which said first and second cancellation circuit output signals are applied for providing differential amplification thereof, said common mode cancellation circuit including a voltage divider to which said input signals are applied for producing a composite signal at a junction of said voltage divider containing predetermined porportions of said first and second input signals, said common mode cancellation circuit also including an inverting ampliifer coupled to said junction and responsive to said composite signal for producing a cancellation signal of the form $(-K_1A/2 - K_2B/2 - CM)$ where $K_1$ and $K_2$ are constants, and said common mode cancellation circuit further including summing means to which said first and second input signals and said cancellation signal are applied for algebraically summing each of first and second input signals with said cancellation signal to produce said first and second cancellation circuit output signals.

2. The invention in accordance with claim 1, wherein each of said first and second common mode cancellation circuit output signals contains both A and B components of said input signals.

3. The invention in accordance with claim 1, wherein said first and second common mode cancellation circuit output signals are designatable as (A/2 − B/2) and (−A/2 + B/2).

4. The invention in accordance with claim 1, wherein said voltage divider combines said first and second input signals (A + CM) and (B + CM) in a manner to produce at said junction a composite signal designatable as (A/2 + B/2 + CM).

5. The invention in accordance with claim 1, wherein said inverting amplifier has unity gain.

6. The invention in accordance with claim 1, wherein said common mode cancellation circuit additionally includes a phase compensation network coupled to the output of said inverting amplifier for compensating for phase variation produced thereby.

7. The invention in accordance with claim 1, wherein said first and second common mode cancellation output signals are produced at respective first and second common mode cancellation circuit output terminals, and wherein said summing means includes first and second summing resistors respectivey coupling said cancellation signal to said first and second output terminals and third and fourth summing resistors respectively coupling said first and second input signals to said first and second output terminals.

* * * * *